(12) United States Patent
Yu

(10) Patent No.: US 10,355,228 B2
(45) Date of Patent: Jul. 16, 2019

(54) METHOD OF MANUFACTURING FLEXIBLE SUBSTRATE AND FLEXIBLE SUBSTRATE

(71) Applicant: Wuhan China Star Optoelectronics Semiconductor Display Technology Co., Ltd., Wuhan, Hubei (CN)

(72) Inventor: Yun Yu, Hubei (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 15/749,260

(22) PCT Filed: Nov. 3, 2017

(86) PCT No.: PCT/CN2017/109301
§ 371 (c)(1),
(2) Date: Jan. 31, 2018

(87) PCT Pub. No.: WO2019/080160
PCT Pub. Date: May 2, 2019

(65) Prior Publication Data
US 2019/0123289 A1  Apr. 25, 2019

(30) Foreign Application Priority Data
Oct. 23, 2017 (CN) .......................... 2017 1 0994571

(51) Int. Cl.
*H01L 51/00* (2006.01)
*H01L 51/52* (2006.01)
*H01L 51/56* (2006.01)

(52) U.S. Cl.
CPC ........ *H01L 51/0097* (2013.01); *H01L 51/003* (2013.01); *H01L 51/529* (2013.01); *H01L 51/5253* (2013.01); *H01L 51/56* (2013.01)

(58) Field of Classification Search
CPC . H01L 51/0097; H01L 51/56; H01L 51/5253; H01L 51/003; H01L 51/529
USPC .......................................................... 257/40
See application file for complete search history.

(56) References Cited

U.S. PATENT DOCUMENTS

2014/0323006 A1* 10/2014 Song ................... H01L 51/003
445/24

FOREIGN PATENT DOCUMENTS

CN 105226186 A 1/2016
CN 106356472 A 1/2017

* cited by examiner

*Primary Examiner* — Karen Kusumakar
*Assistant Examiner* — Adam S Bowen
(74) *Attorney, Agent, or Firm* — Hauptman Ham, LLP

(57) ABSTRACT

A method of manufacturing flexible substrate is provided, the method comprising following steps: pasting a heat dissipation sheet on a carrier substrate; preparing a thermal insulating layer on the heat dissipation sheet; preparing a flexible substrate layer on the thermal insulating layer; preparing a display element on the flexible substrate layer; and separating the carrier substrate and the heat dissipation sheet and obtaining a flexible substrate. The method of manufacturing flexible substrate and the flexible substrate are provided by this invention, which could reduce thickness of flexible substrate and enhances curving property.

15 Claims, 3 Drawing Sheets

METHOD OF MANUFACTURING FLEXIBLE SUBSTRATE AND FLEXIBLE SUBSTRATE

RELATED APPLICATIONS

The present application is a National Phase of International Application Number PCT/CN2017/109301, filed Nov. 3, 2017, and claims the priority of China Application No. 201710994571.5, filed Oct. 23, 2017.

FIELD OF THE DISCLOSURE

The disclosure relates to a display technical field, and more particularly to a method of manufacturing flexible substrate and flexible substrate.

BACKGROUND

OLED (Organic Light-Emitting Diode) has number of advantageous such as light weight, self-illumination, wide view angle, low driving voltage, high effectiveness of emitting, low power consumption and fast response speed, and therefore is widely used. Especially the flexible OLED display device has characteristics of being flexible and easy to carry, is now a major sector of research and development of the field of display technology. Wherein, the manufacturing of flexible substrate is a key technology to achieve flexible OLED display element, and reduces thickness of the flexible substrate, enhances curvable of flexible substrate are become the most important research direction.

In prior art: FIG. 1a-1c are schematic view of existing method of manufacturing flexible substrate. Please refer to FIG. 1a, the carrier substrate 1' is a glass plate, coating a flexible substrate layer 2' on the carrier substrate 1', and then preparing a display unit 3' on the flexible substrate layer 2'. Next, please refer to FIG. 1b, peeling the flexible substrate layer 2' which on backwardly of the carrier substrate by laser lift off. Next, please refer to FIG. 1c, after separating the flexible substrate layer 2' and the carrier substrate 1, pasting the first adhesive layer 4', PET layer 5', the second adhesive layer 6' and the copper heat dissipation layer 7' on the flexible substrate layer 2' by sequentially. (After separating the carrier substrate 1' and the flexible substrate layer 2' has the display unit 3', the thinner portion will be curved such that can't achieve the following process.) Wherein, thickness of the flexible substrate layer 2' is 8-15 µm, thickness of the first adhesive layer 4' is 10-25 µm, thickness of the PET layer 5' is 25-50 µm, thickness of the second adhesive layer 6' is 10-25 µm, thickness of the copper heat dissipation layer 7' is 50-80 µm. The totally thickness of the flexible substrate which stacked the copper heat dissipation layer 7', the second adhesive layer 6', PET layer 5', the first adhesive layer 4', the flexible substrate layer 2', the display unit 3' is 100~200 µm, the flexible substrate has worse curving property.

SUMMARY

A technical problem to be solved by the disclosure is to provide a method of manufacturing flexible substrate and flexible substrate with decreases thickness of flexible substrate and enhances property of curving.

An objective of the disclosure is achieved by following embodiments. In particular, a method of manufacturing flexible substrate comprising following steps.

pasting a heat dissipation sheet on a carrier substrate;
preparing a thermal insulating layer on the heat dissipation sheet;
preparing a flexible substrate layer on the thermal insulating layer;
preparing a display element on the flexible substrate layer; and
separating the carrier substrate and the heat dissipation sheet and obtaining a flexible substrate.

In an embodiment, before the step of pasting a heat dissipation sheet on a carrier substrate, further comprising:
preparing an adhesive layer on the carrier substrate;
pasting the heat dissipation layer on the carrier substrate, which specifically step is pasting the heat dissipation layer on the carrier substrate by the adhesive layer.

In an embodiment, the specifically steps of separating the carrier substrate and the heat dissipation sheet which is according by laser lift-off or mechanical exfoliation;
wherein after separated the carrier substrate and the heat dissipation sheet, washing a surface of the heat dissipation sheet which contacted with the adhesive layer.

In an embodiment, the carrier substrate is glass plate and the heat dissipation sheet is copper foil.

In an embodiment, thickness of the flexible substrate layer is 8~15 µm, thickness of the thermal insulating layer is 0.05~0.3 µm, thickness of the heat dissipation sheet is 50~100 µm.

In an embodiment, in the step of preparing a display element on the flexible substrate layer further comprises steps:
coating polyimide liquid on the thermal insulating layer;
curing polyimide liquid on the thermal insulating layer by backing and obtains the flexible substrate layer.

In an embodiment, in the step of preparing the thermal insulating layer on the heat dissipation sheet further comprises steps:
depositing at least one material of aluminum oxide, chromium, molybdenum, aluminum alloy, chromium alloy, molybdenum alloy on the heat dissipation sheet by physical vapor deposition and obtains the thermal insulating layer.

In an embodiment, thickness of the flexible substrate is 60~120 µm.

According to another aspect of the disclosure, the disclosure further provides a method of manufacturing flexible substrate comprising steps.

pasting a heat dissipation sheet on a carrier substrate, the carrier substrate is glass plate, the heat dissipation sheet is copper foil;
preparing a thermal insulating layer on the heat dissipation sheet;
preparing a flexible substrate layer on the thermal insulating layer;
preparing a display element on the flexible substrate layer; and
separating the carrier substrate and the heat dissipation sheet and obtaining a flexible substrate;
wherein before the step of pasting a heat dissipation sheet on a carrier substrate, further comprising:
preparing an adhesive layer on the carrier substrate;
pasting the heat dissipation layer on the carrier substrate, which specifically step is pasting the heat dissipation layer on the carrier substrate by the adhesive layer.

In an embodiment, the specifically steps of separating the carrier substrate and the heat dissipation sheet which is according by laser lift-off or mechanical exfoliation;
wherein after separated the carrier substrate and the heat dissipation sheet, washing a surface of the heat dissipation sheet which contacted with the adhesive layer.

In an embodiment, thickness of the flexible substrate layer is 8~15 μm, thickness of the thermal insulating layer is 0.05~0.3 μm, thickness of the heat dissipation sheet is 50~100 μm.

In an embodiment, in the step of preparing a display element on the flexible substrate layer further comprises steps:

coating polyimide liquid on the thermal insulating layer;

curing polyimide liquid on the thermal insulating layer by backing and obtains the flexible substrate layer.

In an embodiment, in the step of preparing the thermal insulating layer on the heat dissipation sheet further comprises steps:

depositing at least one material of aluminum oxide, chromium, molybdenum, aluminum alloy, chromium alloy, molybdenum alloy on the heat dissipation sheet by physical vapor deposition and obtains the thermal insulating layer.

In an embodiment, thickness of the flexible substrate is 60~120 μm.

According to another aspect of the disclosure, the disclosure further provides a flexible substrate. The flexible substrate, comprising a heat dissipation sheet, a thermal insulating layer positioned on the heat dissipation sheet, a flexible substrate layer positioned on the thermal insulating layer, and a display element positioned on the flexible substrate layer.

In an embodiment, thickness of the flexible substrate layer is 8~15 μm, thickness of the thermal insulating layer is 0.05~0.3 μm, thickness of the heat dissipation sheet is 50~100 μm, thickness of the flexible substrate is 60~120 μm.

In sum, the present invention provides a method of manufacture flexible substrate and a flexible substrate. It decreases thickness of flexible substrate which made a more thinly flexible substrate. It enhances property of bending and curving of the flexible substrate by decreases thickness of flexible substrate.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

The specific structural and functional details disclosed herein are only representative and are intended for describing exemplary embodiments of the disclosure. However, the disclosure can be embodied in many forms of substitution, and should not be interpreted as merely limited to the embodiments described herein.

The disclosure will be further described in detail with reference to accompanying drawings and preferred embodiments as follows.

Figure 1A:
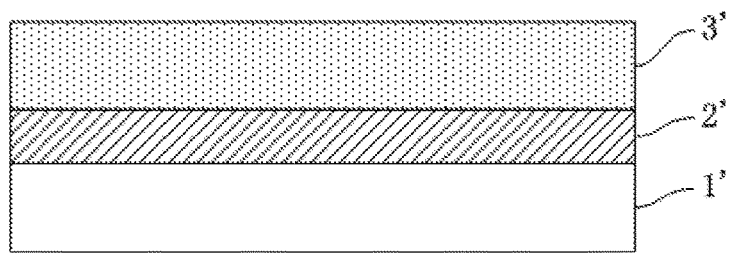
FIG. 1a is a prior art of schematic view of step 1 for a method of manufacturing flexible substrate.
Figure 1B:
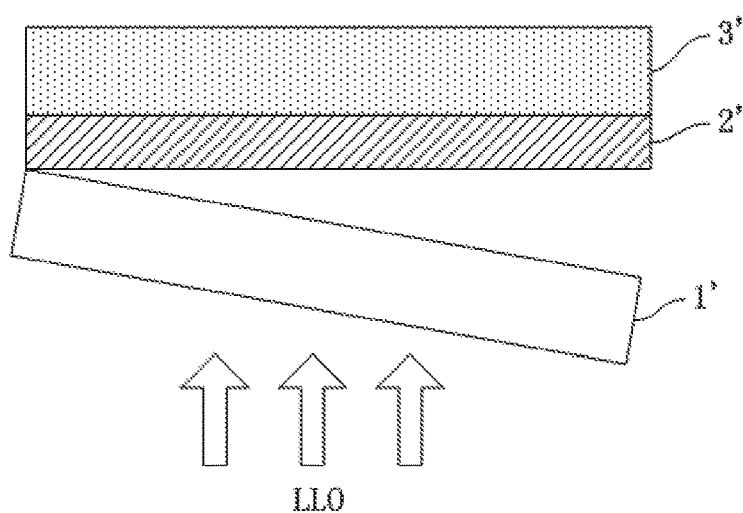
FIG. 1b is a prior art of schematic view of step 2 for a method of manufacturing flexible substrate.
Figure 1C:
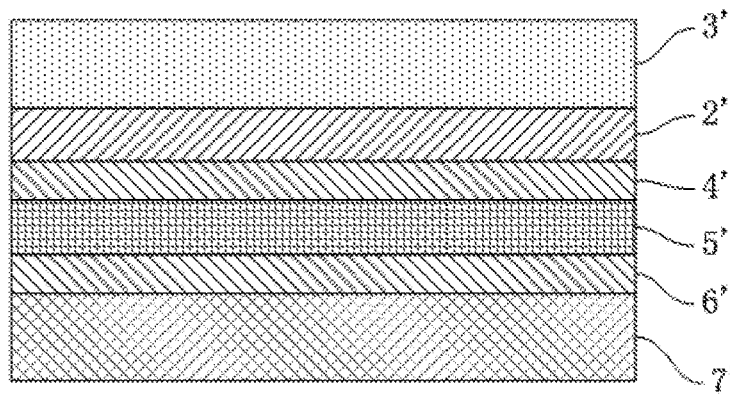
FIG. 1c is a prior art of schematic view of step 3 for a method of manufacturing flexible substrate.
Figure 2:
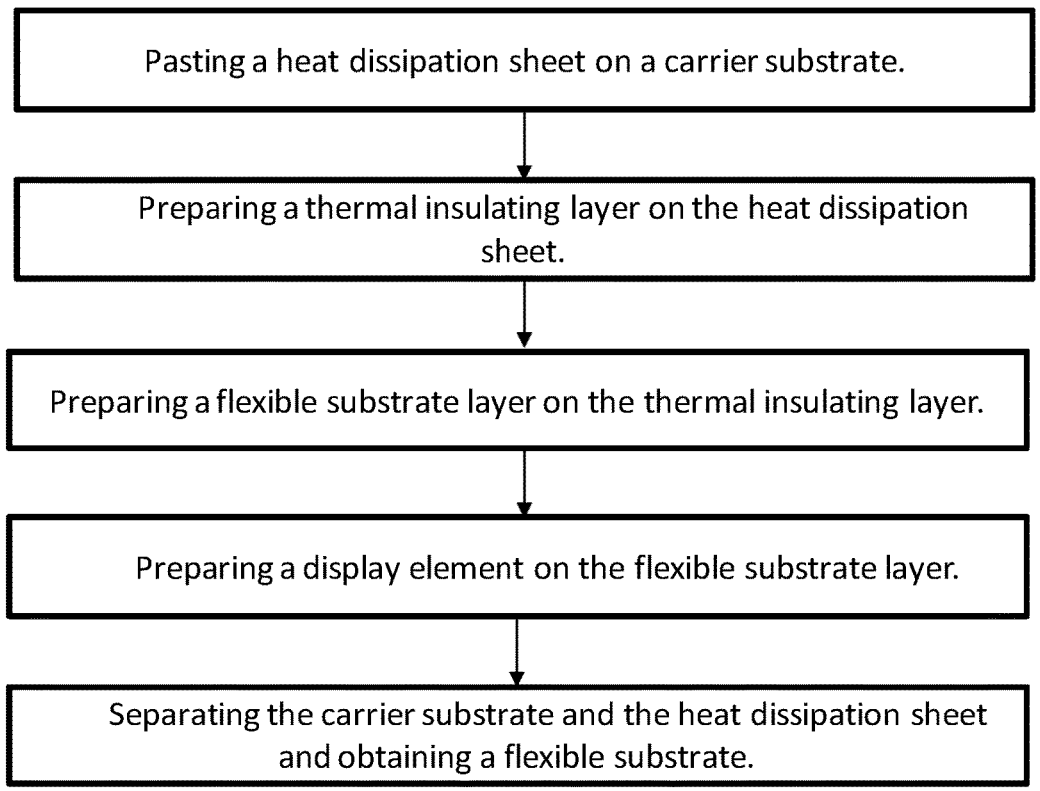
FIG. 2 is a flowchart of a method of manufacturing flexible substrate according to an embodiment of the disclosure.

The present invention provides a method of manufacturing flexible substrate, please refer to FIG. 2. The method comprising following steps:

pasting a heat dissipation sheet on a carrier substrate;

preparing a thermal insulating layer on the heat dissipation sheet;

preparing a flexible substrate layer on the thermal insulating layer;

preparing a display element on the flexible substrate layer; and separating the carrier substrate and the heat dissipation sheet and obtaining a flexible substrate, wherein the flexible substrate includes a heat dissipation sheet, a thermal insulating layer, a flexible substrate layer and a display element positioned by sequentially.

Further, before the step of pasting a heat dissipation sheet on a carrier substrate, further comprising:

preparing an adhesive layer on the carrier substrate;

pasting the heat dissipation layer on the carrier substrate, which specifically step is pasting the heat dissipation layer on the carrier substrate by the adhesive layer.

Further, the adhesive layer is an optical cement for example, OCA (Optically Clear Adhesive), OCR(Optically Clear Resin).

The specifically steps of separating the carrier substrate and the heat dissipation sheet which is according by laser lift-off or mechanical exfoliation.

After separated the carrier substrate and the heat dissipation sheet further comprising following steps:

washing a surface of the heat dissipation sheet which contacted with the adhesive layer for removing the adhesive material which residue on the surface of the heat dissipation sheet and pollution.

Washing a surface of the heat dissipation sheet which contacted with the adhesive layer. Specifically, emitting UV light on the surface which contacted with the adhesive layer of the heat dissipation sheet, removes oxides contaminate on surface. And then washing the surface by ozone water which could dissolve organic, acid detergent, alkaline detergent, at least washing by water and backing.

Function of the heat dissipation sheet is to dissipate heat between the flexible substrate and battery module positioned on backward of flexible substrate, and between the flexible substrate and major electric circuit. At the same time, the heat dissipation sheet could support the flexible substrate layer.

Further, the carrier substrate is glass plate and the heat dissipation sheet is copper foil.

Further, thickness of the flexible substrate layer is 8~15 μm, thickness of the thermal insulating layer is 0.05~0.3 μm, thickness of the heat dissipation sheet is 50~100 μm.

Further, wherein in the step of preparing a display element on the flexible substrate layer further comprises steps:

coating polyimide liquid on the thermal insulating layer;

curing polyimide liquid on the thermal insulating layer by backing and obtains the flexible substrate layer.

Further, in the step of preparing the thermal insulating layer on the heat dissipation sheet further comprises steps:

depositing at least one material of aluminum oxide (which is Al₂O₃), chromium, molybdenum, aluminum alloy, chromium alloy, molybdenum alloy on the heat dissipation sheet by physical vapor deposition and obtains the thermal insulating layer.

Wherein, the molybdenum alloy is for example molybdenum tungsten alloy. Function of the thermal insulating layer is protect the heat dissipation layer positioned under the flexible substrate layer to be damaged while the high temperature process for the display element on the flexible substrate layer. Wherein the high temperature process of the display element for example the processing for TFT (Thin Film Transistor) array substrate, crystallization of a-Si by suddenly high temperature by ELA (Excimer Laser Annel).

Further, thickness of the flexible substrate is 60~120 μm.

The method of manufacturing the flexible substrate in the present invention. It could reduce thickness of the flexible substrate base on the existing flexible substrate, and achieved to 60~120 μm. At the same time, reduces the PET layer to be a supporting plate, and preparing adhesive layer on the upper/under lateral side of PET layer not only could enhance curve property of flexible substrate but also reduce steps for manufacture flexible substrate, which enhance yield of flexible substrate. The flexible substrate obtained by the above method could be applied to OLED flexible display device by technology of LTPS (Low Temperature Polysilicon), IGZO (indium gallium zinc oxide), especially for small size mobile phone panel.

Another embodiment of the method of manufacturing flexible substrate in this invention.

Figure 3A:
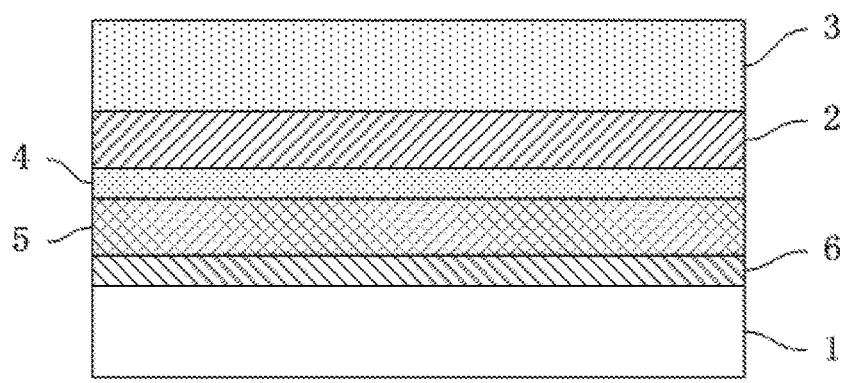
FIG. 3a is a schematic view of step 1 for a method of manufacturing flexible substrate according to another embodiment of the disclosure.

The flexible substrate 1 comprising a heat dissipation sheet 6, a heat dissipation sheet 5, a thermal insulating layer 4, a flexible substrate layer 2, a display element 3 which are positioned by sequentially. The structure shown as FIG. 3a.

Figure 3B:
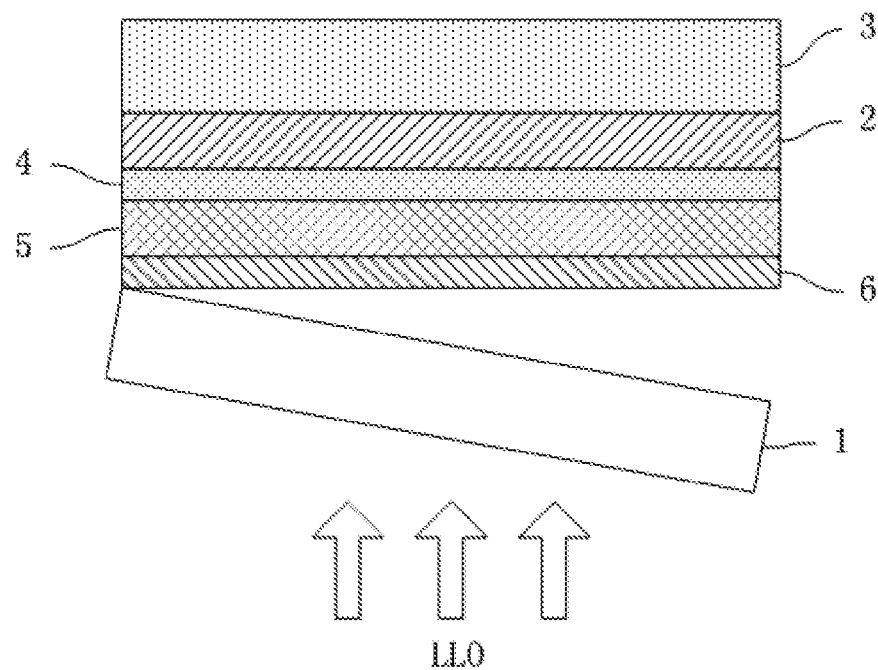
FIG. 3b is a schematic view of step 2 for a method of manufacturing flexible substrate according to another embodiment of the disclosure.

Please refer to FIG. 3b. Separating the carrier substrate 1 and the heat dissipation sheet 5 by laser lift-off, and obtain the flexible substrate. The structure of the flexible substrate is shown as FIG. 4.

Figure 4:
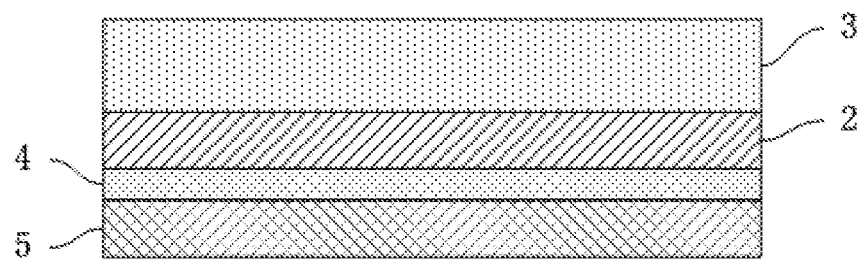
FIG. 4 is a structural schematic view of a flexible substrate according to an embodiment of the disclosure.

The present invention further comprises another flexible substrate, please refer to FIG. 4. The flexible substrate comprises: a dissipation sheet 5, a thermal insulating layer 4 is positioned on the dissipation sheet 5, a flexible substrate layer 2 is positioned on the insulating layer 4, and a display element 3 is positioned on the flexible substrate layer 2.

Further, thickness of the flexible substrate layer 2 is 8~15 μm, thickness of the thermal insulating layer 4 is 0.05~0.3 μm, thickness of the heat dissipation sheet 5 is 50~100 μm, thickness of the flexible substrate is 60~120 μm.

In sum, the present invention provides a method of manufacture flexible substrate and a flexible substrate. It decreases thickness of flexible substrate which made a more thinly flexible substrate. It enhances property of bending and curving of the flexible substrate by decreases thickness of flexible substrate.

The foregoing contents are detailed description of the disclosure in conjunction with specific preferred embodiments and concrete embodiments of the disclosure are not limited to these description. For the person skilled in the art of the disclosure, without departing from the concept of the disclosure, simple deductions or substitutions can be made and should be included in the protection scope of the application.

What is claimed is:

1. A method of manufacturing flexible substrate, comprising:

pasting a heat dissipation sheet on a carrier substrate;
preparing a thermal insulating layer on the heat dissipation sheet;
preparing a flexible substrate layer on the thermal insulating layer;
preparing a display element on the flexible substrate layer; and
separating the carrier substrate and the heat dissipation sheet and obtaining a flexible substrate;
wherein before the step of pasting the heat dissipation sheet on the carrier substrate, further comprising:
preparing an adhesive layer on the carrier substrate;
pasting the heat dissipation layer on the carrier substrate, which specifically step is pasting the heat dissipation layer on the carrier substrate by the adhesive layer.

2. The method of manufacturing flexible substrate according to claim 1, wherein the specifically steps of separating the carrier substrate and the heat dissipation sheet which is according by laser lift-off or mechanical exfoliation;
wherein after separated the carrier substrate and the heat dissipation sheet, washing a surface of the heat dissipation sheet which contacted with the adhesive layer.

3. The method of manufacturing flexible substrate according to claim 1, wherein the carrier substrate is glass plate and the heat dissipation sheet is copper foil.

4. The method of manufacturing flexible substrate according to claim 1, wherein thickness of the flexible substrate layer is 8~15 μm, thickness of the thermal insulating layer is 0.05~0.3 μm, thickness of the heat dissipation sheet is 50~100 μm.

5. The method of manufacturing flexible substrate according to claim 1, wherein in the step of preparing the display element on the flexible substrate layer further comprises steps:

coating polyimide liquid on the thermal insulating layer;
curing polyimide liquid on the thermal insulating layer by backing and obtains the flexible substrate layer.

6. The method of manufacturing flexible substrate according to claim 1, wherein in the step of preparing the thermal insulating layer on the heat dissipation sheet further comprises steps:

depositing at least one material of aluminum oxide, chromium, molybdenum, aluminum alloy, chromium alloy, molybdenum alloy on the heat dissipation sheet by physical vapor deposition and obtains the thermal insulating layer.

7. The method of manufacturing flexible substrate according to claim 1, wherein thickness of the flexible substrate is 60~120 μm.

8. A method of manufacturing flexible substrate, comprising:

pasting a heat dissipation sheet on a carrier substrate, the carrier substrate is glass plate, the heat dissipation sheet is copper foil;
preparing a thermal insulating layer on the heat dissipation sheet;
preparing a flexible substrate layer on the thermal insulating layer;
preparing a display element on the flexible substrate layer; and
separating the carrier substrate and the heat dissipation sheet and obtaining a flexible substrate;
wherein before the step of pasting the heat dissipation sheet on the carrier substrate, further comprising:
preparing an adhesive layer on the carrier substrate;

pasting the heat dissipation layer on the carrier substrate, which specifically step is pasting the heat dissipation layer on the carrier substrate by the adhesive layer.

9. The method of manufacturing flexible substrate according to claim 8, wherein the specifically steps of separating the carrier substrate and the heat dissipation sheet which is according by laser lift-off or mechanical exfoliation;
wherein after separated the carrier substrate and the heat dissipation sheet, washing a surface of the heat dissipation sheet which contacted with the adhesive layer.

10. The method of manufacturing flexible substrate according to claim 8, wherein thickness of the flexible substrate layer is 8~15 μm, thickness of the thermal insulating layer is 0.05~0.3 μm, thickness of the heat dissipation sheet is 50~100 μm.

11. The method of manufacturing flexible substrate according to claim 8, wherein in the step of preparing the display element on the flexible substrate layer further comprises steps:
coating polyimide liquid on the thermal insulating layer;
curing polyimide liquid on the thermal insulating layer by backing and obtains the flexible substrate layer.

12. The method of manufacturing flexible substrate according to claim 8, wherein in the step of preparing the thermal insulating layer on the heat dissipation sheet further comprises steps:
depositing at least one material of aluminum oxide, chromium, molybdenum, aluminum alloy, chromium alloy, molybdenum alloy on the heat dissipation sheet by physical vapor deposition and obtains the thermal insulating layer.

13. The method of manufacturing flexible substrate according to claim 8, wherein thickness of the flexible substrate is 60~120 μm.

14. A flexible substrate, comprising a heat dissipation sheet, a thermal insulating layer positioned on the heat dissipation sheet, a flexible substrate layer positioned on the thermal insulating layer, and a display element positioned on the flexible substrate layer;
wherein the heat dissipation sheet is copper foil.

15. The flexible substrate according to claim 14, wherein thickness of the flexible substrate layer is 8~15 μm, thickness of the thermal insulating layer is 0.05~0.3 μm, thickness of the heat dissipation sheet is 50~100 μm, thickness of the flexible substrate is 60~120 μm.

* * * * *